(12) United States Patent
Schultz

(10) Patent No.: US 6,861,864 B2
(45) Date of Patent: Mar. 1, 2005

(54) SELF-TIMED RELIABILITY AND YIELD VEHICLE ARRAY

(75) Inventor: Richard Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 154 days.

(21) Appl. No.: 10/418,560

(22) Filed: Apr. 16, 2003

(65) Prior Publication Data

US 2004/0207406 A1 Oct. 21, 2004

(51) Int. Cl.[7] .............................................. G01R 31/26
(52) U.S. Cl. ..................... 324/765; 324/158.1
(58) Field of Search ............................ 324/158.1, 765, 324/763, 760; 714/718, 720, 30; 365/230.03; 257/48

(56) References Cited

U.S. PATENT DOCUMENTS 5,299,204 A * 3/1994 Daniel ........................ 714/724
5,674,651 A * 10/1997 Nishi ........................... 430/22
6,092,223 A * 7/2000 Ahn ............................ 714/711
6,436,741 B2 * 8/2002 Sato et al. .................. 438/149
6,483,176 B2   11/2002 Noguchi et al.
6,707,064 B2    3/2004 Jang et al.

* cited by examiner

Primary Examiner—Evan Pert
Assistant Examiner—Tung X. Nguyen
(74) Attorney, Agent, or Firm—The Law Offices of William W. Cochran, II, LLC

(57) ABSTRACT

A test vehicle a system and method for evaluating an interconnect module manufacturing process while dynamically testing performance with high-speed operational frequencies is disclosed. An interconnect module designed at many of the manufacturing process limits offers complete and fast failure analysis so that manufacturing defects can be quickly located and the process improved. Failure analysis, particularly on 90 nm technologies and beyond is becoming extremely difficult. At-speed testing is also becoming very important to the yield and reliability of products. This invention incorporates a self-timed speed circuit that can detect subtle resistive faults and also show the exact location in the array where the speed fault occurred based on test program datalogs from scan flip flops.

24 Claims, 5 Drawing Sheets

SELF-TIMED RELIABILITY AND YIELD VEHICLE ARRAY

BACKGROUND OF THE INVENTION a. Field of the Invention

The present invention pertains to integrated circuit manufacturing and specifically to test samples used to qualify a new manufacturing process.

b. Description of the Background

In the development of a new manufacturing process for integrated circuits (interconnect modules), certain design rules are created that define the capabilities of the process. A designer begins the design of new integrated circuits at the same time as the manufacturing capability is being developed. The concurrency of new process development and product design places great importance on the ability of the manufacturing process to be able to produce integrated circuits using those design rules.

The design rules include such things as minimum trace width, minimum distance between traces, the maximum number of vias that may be stacked on top of each other, and other such parameters. Typically, a manufacturer may guarantee that a process will manufacture good parts if the parts conform to the design rules, thus allowing the designers to begin integrated circuit designs many months before the manufacturing process is ready.

After the first production of a new integrated circuit design, there is generally a period of failure analysis as the design and manufacturing processes are adjusted to produce a successful product. The root cause failure analysis of some integrated circuits may be very time consuming, sometimes consuming days or even weeks to isolate a single fault on a chip.

The failure analysis techniques available to development engineers include mechanical probing, optical beam induced current (OBIC), optical beam induced resistive change (OBIRCH), picosecond imaging circuit analysis (PICA), light induced voltage alterations (LIVA), charge induced voltage alterations (CIVA), various scanning electron microscopy (SEM) techniques, and other techniques known in the art. In addition, destructive tests, such as etching and lapping, may be used to isolate and identify problems.

In many cases, the design of an integrated circuit may limit or prohibit certain techniques for ascertaining faults. For example, in order to probe a certain path using a laser technique, the path must not have another metal trace directly above the path of interest. Further, the various techniques may only isolate a problem within a certain section of the circuitry, but not to a specific trace or via.

During process development and verification, it is important that faults are isolated to an exact location. For example, a via may have very high resistivity. In order for the manufacturing process to be corrected, the location of the via must be identified exactly. Failure analysis techniques that isolate only a section of an electric path are not sufficient for the fine-tuning of the manufacturing process.

Memories can be self-timed circuits and the location of the fault in the memory array can be shown based on test program data logs. This is typically referred to as bit mapping. The bit mapping routines typically consume thousands of megabytes of tester memory and require many test pins to test. Memories typically only look at the first few layers or a process and do not have typical structures seen in analog circuits or in digital circuits.

Memories require expensive test platforms for testing due to the high tester pattern memory requirements and cannot look at all process layers or subsets of layers for yield and reliability. Memory structures are fixed and do not look like analog circuits or digital circuits and therefore suffer from the same yield or reliability issues. Commercially available fault tester systems such as PDF Solutions and KLA Microloop structures that use SEM or Optical inspection are very slow to test, cannot be used for reliability testing and increase the cycle time though manufacturing.

Failure analysis, particularly on 90 nm technologies and beyond is becoming extremely difficult. At-speed testing, which is the process of placing an application specific integrated circuit (ASIC) or interconnect module on a tester and running fault coverage and performance test patterns at the speed the part will run in the system, is becoming very important to the yield and reliability of products.

It would therefore be advantageous to provide a system and method for testing an integrated circuit manufacturing process wherein failure analysis techniques may be used to quickly isolate and locate a manufacturing defect and be fast enough to be utilized for reliability testing. It would further be advantageous if the system and method were able to stress the manufacturing process by operating at the design limits of the manufacturing process.

SUMMARY OF THE INVENTION

The present invention overcomes the disadvantages and limitations of the prior art by providing a system and method for evaluating an integrated circuit manufacturing process while dynamically testing performance with high-speed operational frequencies. An integrated circuit designed at many of the manufacturing process limits offers complete and fast failure analysis so that manufacturing defects can be quickly located and the process improved.

This invention incorporates a self-timed speed circuit that can detect subtle resistive faults and also show the exact location in the array where the speed fault occurred based on test program datalogs from scan flip flops.

The present invention may therefore comprise method of locating a fault within an array of integrated circuits comprising: establishing a first propagation speed for a signal passing through a first self timed circuit within the array of interconnect modules containing a first row of serially connected interconnect modules, establishing row propagation speeds for signals passed through a number of rows of serially connected interconnect modules of a subarray within the array of interconnect modules, comparing the row propagation speed to the first propagation speed to establish a row fault criteria, establishing a second propagation speed for a signal passing through a second self timed circuit within the array of interconnect modules containing a first column of serially connected interconnect modules, establishing column propagation speeds for signals passing through a plurality of columns of serially connected interconnect modules of the subarray within the array of interconnect modules, comparing the column propagation speed with the first propagation speed to establish a column fault criteria, generating a matrix of row and column fault conditions based upon the row and column fault criteria, locating a fault within the array of interconnect modules by utilizing the row and column fault conditions within the matrix that correspond to an array location.

The present invention may further comprise a self timed speed fault test vehicle for locating a fault within an array of interconnect modules comprising: a first self timed circuit containing a row of serially connected interconnect modules within said array of interconnect modules that establishes a first propagation speed of a signal passing through said first self timed circuit, a second self timed circuit containing a column of serially connected interconnect modules within said array of interconnect modules that establishes a second propagation speed of a signal passing through said second self timed circuit, a subarray of interconnect modules disposed within said array of interconnect modules comprising rows and columns of serially connected interconnect modules, a first comparator that compares the row propagation speed of signals passed through each row of serially connected interconnect modules within said subarray to said first propagation speed, said comparison establishing a row fault criteria, a second comparator that compares the column propagation speed of signals passed through each column of serially connected interconnect modules within said subarray to said second propagation speed, said comparison establishing a column fault criteria, a matrix of row and column fault conditions that is generated based upon said row and column fault criteria, a fault location map generated by utilizing said row and column fault conditions within said matrix that correspond to array locations.

The advantages of the present invention are that an integrated circuit may be manufactured that stresses many of the design limits of the manufacturing process. Further, At-speed testing allows an engineer or technician to very quickly pinpoint the exact root cause and failure location and thereby quickly ascertain any improvements or changes that need to be made to the manufacturing process. Additionally, a manufacturing process may be monitored and verified by periodically manufacturing and testing the test vehicle. The test vehicle is a test chip that is used for design, evaluation reliability and manufacturing purposes and is utilize to validate a design before full commercialization. The present invention provides a test platform with less than 200 vectors and only uses 6 pins and, since the device is self-timed, it is not limited by tester clock speed. Therefore, an externally driven clock frequency does not limit the maximum frequency to the tester limit. Hence, the disclosed invention can detect subtle resistive defects.

In addition, the test vehicle has very low tester memory requirements, very low pin count and very low pattern length. The interconnect modules are also programmable. Hence, on a statistical basis, each array can have one type of interconnect module. If one type of array fails more than another, then it can be determined that a particular interconnect module may be unreliable. Arrays may also be burned in for reliability testing.

DETAILED DESCRIPTION OF THE INVENTION

Figure 1:
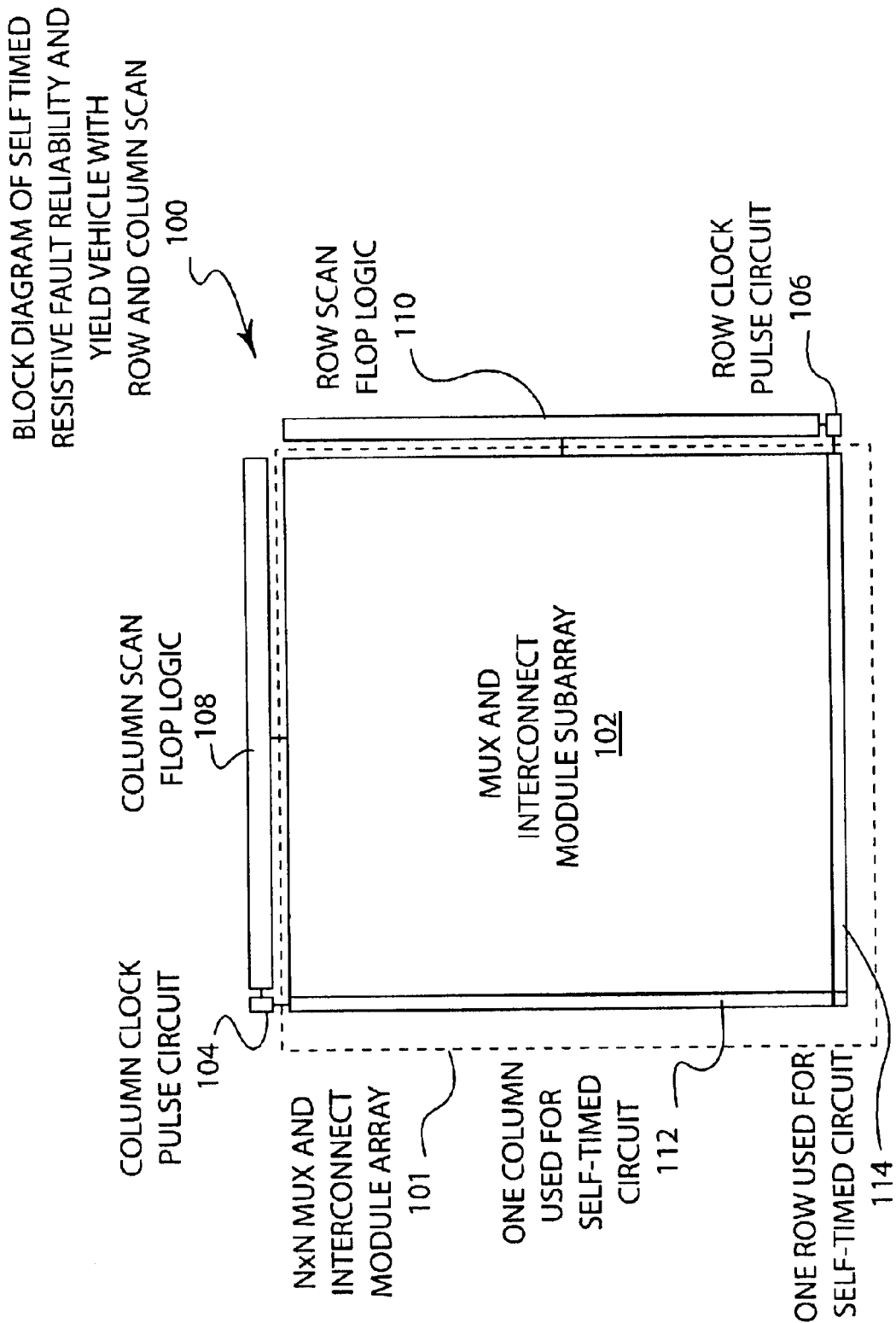
FIG. 1 is an illustration of an embodiment of a self-timed resistive fault test vehicle in which resistive fault reliability and yield are tested and failures located.

FIG. 1 illustrates an embodiment 100 of a self-timed resistive fault test vehicle in which resistive fault reliability and yield are tested and failures located for an integrated circuit. A column clock pulse circuit 104 receives a signal from the first column 112 of an N×N array of modulator (Mux) and interconnect modules 101. This first column acts as a self-timed circuit that can use a clock edge (usually from lower speed clock signal) and generate a pulse of a certain duration that is used to then time the speed of the other columns within the N×N mux and interconnect subarray 101 shown as the mux and interconnect subarray 102. This timed pulse is used to load the outputs of the other columns into the column scan flop logic 108 and discrepancies are registered. A signal registered in the column scan flop logic 108 that differs from the first column for self-timed circuit 112, indicates that there is an irregularity, fault or some type of error within that particular column.

Similarly, column clock pulse circuit 106 receives a signal from the first row 114 of an N×N array of modulator (Mux) and interconnect modules 101. This first row acts as a self-timed circuit that can use a clock edge (usually from lower speed clock signal) and generate a pulse of a certain duration that is used to then time the speed of the other rows within the N×N mux and interconnect subarray 101 shown as the mux and interconnect subarray 102. This timed pulse is used to load the outputs of the other columns into the column scan flop logic 110 and discrepancies are registered. A signal registered in the row scan flop logic 110 that differs from the first row for self-timed pulse 114, indicates that there is an irregularity, fault or some type of error within that particular row. By combining the information gathered from both the column scan flop logic 108 and the row scan flop logic 110 a matrix can be set up to determine the location of any interconnect modules that are not performing properly.

As shown in FIG. 1, data is transitioned into the first column used for self-timed circuit 112, a clock pulse is generated from the column clock pulse circuit 104 which then clocks the column scan flop logic 108. Additional columns of interconnects are tested in columnar fashion in the mux and interconnect subarray 102 and loads the parallel data from each column into the column scan flop logic 108. The first column signal is compared to each successive column signal in the associated scan flop logic register and analyzed for discrepancies. If all the interconnect modules are the same type of device, with the same capacitance and resistance, etc., the signals should all reach the column scan flop logic 108 at the same time and at a known delay from the first column self-timed circuit 112. Delays or discrepancies in this timing indicate an error in that particular column.

Similarly for the rows, data is transitioned into the first row used for self-timed circuit 114, a clock pulse is generated from the row clock pulse circuit 106 which then clocks the row scan flop logic 110. Additional columns of interconnects are tested in columnar fashion in the mux and interconnect subarray 102 and loads the parallel data from each row into the row scan flop logic 110. The first row signal is compared to each successive row signal in the associated scan flop logic register and analyzed for discrepancies. Again, if all the interconnect modules are the same type of device, with the same capacitance and resistance, etc., the signals should all reach the row scan flop logic 108 at the same time and at a known delay from the first row self-timed circuit 114. Delays or discrepancies in this timing indicate an error in that particular row. By associating the column and row error maps together, an exact location of all the errors in the interconnect modules can be obtained The self-timed resistive fault test vehicle 100 is an integrated circuit design that can be used to perform At-speed testing by placing an ASIC on a the test vehicle and running fault coverage and performance test patterns at the performance speed of the tested part. This test vehicle is also known as a speed fault circuit and can determine speed fault defects within the ASIC. These speed faults are failures within the ASIC that occur at the system speed or performance speed of the tested part, but are undetected At-speeds slower than the system speed due to a resistive defect in the ASIC. The interconnect modules tested by this method and device can include a wide variety of custom or industry standard components such as serpentine structures, comb structures, vias, stacked vias, unstacked vias, minimum design rules, subminimum design rules, greater than minimum design rules or the like.

This invention allows many test techniques to be used to identify and isolate errors within the interconnect array. In order to determine the exact root cause for a failure, it is desirable to locate the exact point where a failure occurred. If the fault is not isolated to a specific location, the manufacturing process cannot be as thoroughly checked and thus process development proceeds at a slower pace. This embodiment allows a process development engineer to produce a hard-to-manufacture design while giving the engineer a fast and reliable method of detection. By manufacturing a self-timed resistive fault test vehicle in which resistive fault reliability and yield are tested and failures located, a test sample may be produced at the limits of the manufacturing processes and is also quickly evaluated to pinpoint any failures, and therefore, may also be used for reliability testing of finished products.

Those skilled in the art may design a self-timed resistive fault test vehicle in which resistive fault reliability and yield are tested and failures located while keeping within the spirit and intent of the present invention. This application is related to U.S. non-provisional application Ser. No. 10/307, 018, entitled "FAILURE ANALYSIS VEHICLE," filed Nov. 27, 2002 by Richard Schultz and Steve Howard, the entire disclosure of which is herein specifically incorporated by reference for all that it discloses and teaches.

Figure 2A:
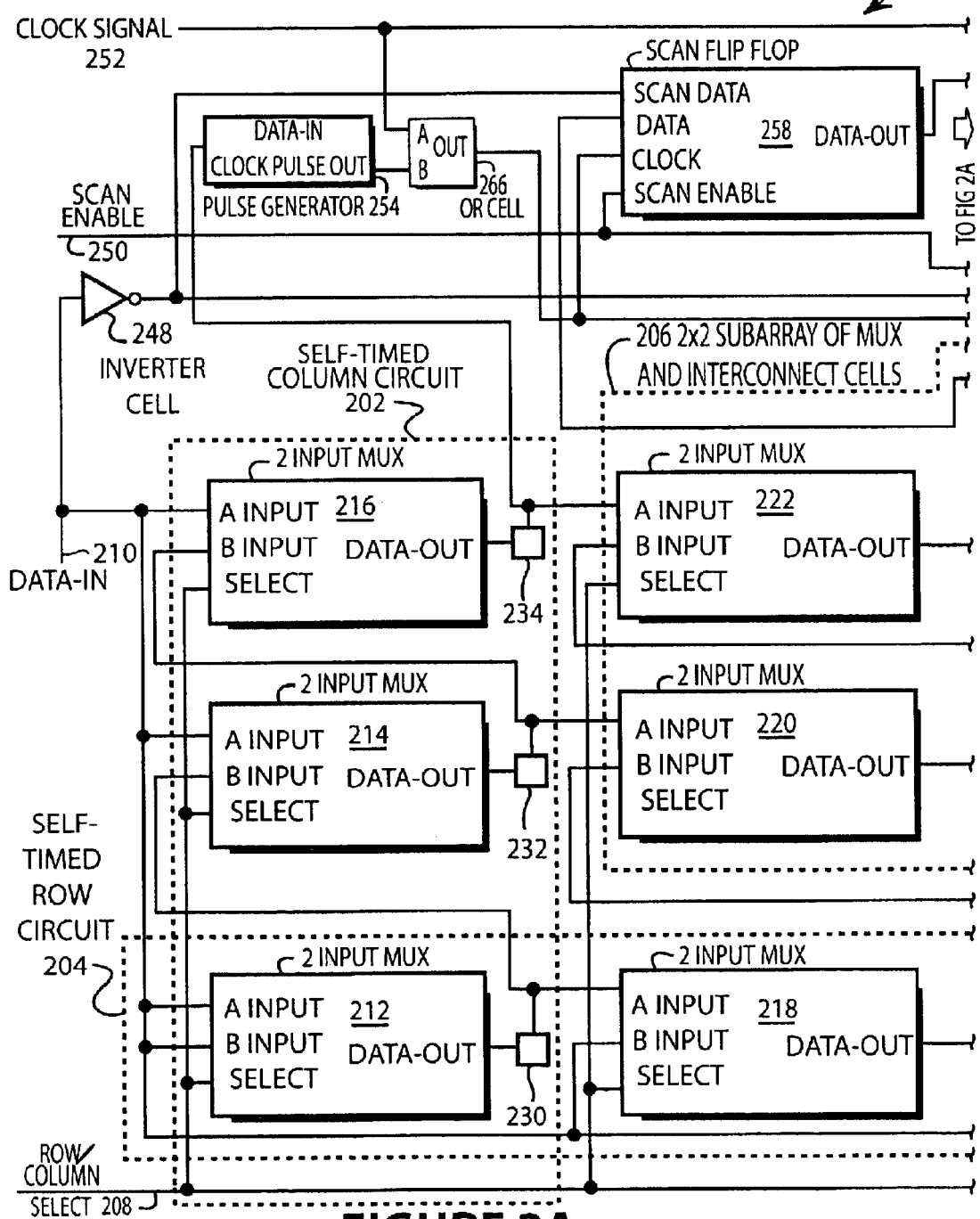
FIG. 2A and FIG. 2B are a schematic diagram of a self-timed resistive fault test vehicle in which resistive fault reliability and yield are tested and failures located.
Figure 2B:
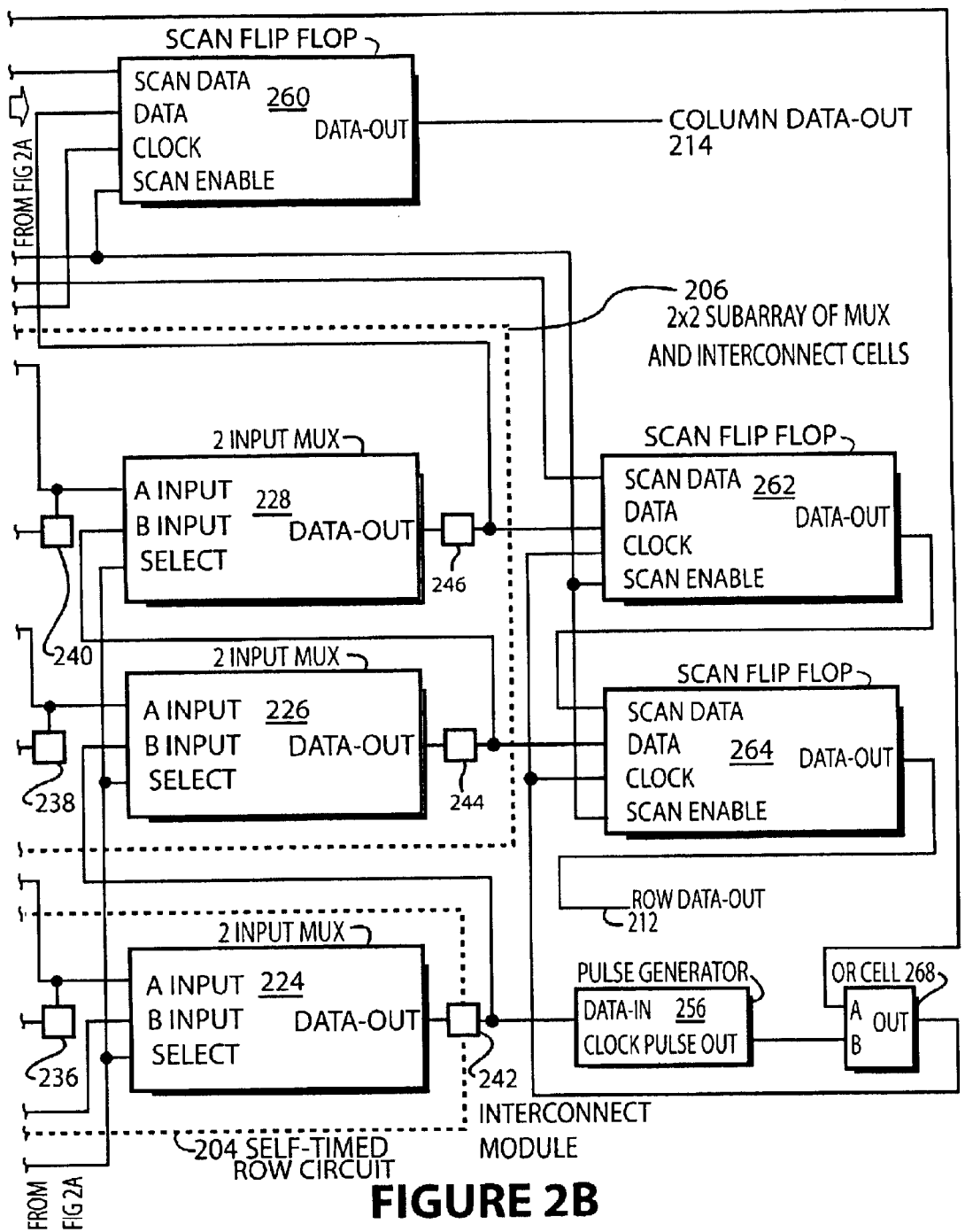

FIG. 2A and FIG. 2B illustrate a schematic representation of the self-timed resistive fault test vehicle 200 where resistive fault reliability and yield are tested and failures located. A large number of interconnect modules (as many as hundreds of thousands) can be subjected to At-speed testing within the self-timed speed circuit shown. Further detailing an example the test vehicle of FIG. 1, a 3×3 array of interconnect modules 230–246 is subjected to At-speed testing to determine faults and their corresponding location within the array. The array of interconnect modules 230–246 is laid out in rows and columns with each interconnect module 230–246 connected to a corresponding 2-input mux 212–228. The first column of muxes and interconnects, the self timed column circuit 202 direct their signal to the column clock pulse circuit (104 of FIG. 1) that includes a pulse generator 254 and an OR cell 266. The columns of muxes and interconnects within the mux and interconnect subarray 206 (102 of FIG. 1), direct their signal to the column scan flop logic circuit (108 of FIG. 1) comprising a series of scan flip flops 258–260, the number of which corresponds to N−1 in the N×N array. In this example N=3, therefore, there are 2 scan flip flops 258 and 260. The pulse generator 254, the OR cell 266, and the first column timing determine the total column timing and generate a clock pulse that serves as a reference for all other columns whose output is registered in the corresponding scan flip flop 258–260 for each column.

The first row of muxes and interconnects, the self timed row circuit 204 direct their signal to the row clock pulse circuit (114 of FIG. 1) that includes a pulse generator 256 and an OR cell 268. The rows of muxes and interconnects within the mux and interconnect subarray 206 (102 of FIG. 1), direct their signal to the row scan flop logic circuit (110 of FIG. 1) comprising a series of scan flip flops 262–264, the number of which corresponds to N−1 in the N×N array. In this example N=3, therefore, there are 2 scan flip flops 262 and 264. The pulse generator 256, the OR cell 268, and the first column timing determine the total row timing and generate a clock pulse that serves as a reference for all other rows whose output is registered in the corresponding scan flip flop 262–264 for each row.

The self-timed speed circuit is initiated with a signal at data-in 210 where the signal path splits to enter an inverter cell 248, the A input of each 2-input mux 212, 214, 216 of the self-timed column circuit 202, and the B input of each 2-input mux 214, 218, 224 of the self-timed row circuit 204. Vertical columns and horizontal rows of interconnect modules are tested separately on the same test vehicle by switching either A input or B input in the 2-input muxes 212–228 by triggering the row/column select toggle 208. In this example, the row/column select toggle 208 will be set to accept B data which will test columns of interconnects vertically in the array.

The data signal at data-in 210 will input a signal to the B input on the 2-input mux 212 in the self-timed column circuit 202, and transmit a signal from the data-out port on the mux 212. This signal is then transmitted to interconnect 230 whereupon the signal branches either vertically up the column (column toggle) or branches horizontally across the row (row toggle) and transmits its data signal to the next mux in a serial fashion. In this case the signal branches to the B input on the next mux in the column 214. The signal is similarly (column toggle) and again transmits its data signal to the B input on the next mux in the column 216. Likewise, the signal is then transmitted to interconnect 234 whereupon the signal branches and transmits its data signal to the data-in port of the pulse generator 254.

The pulse generator 254 generates a clock pulse which is transmitted through the OR cell 266 and is received by the clock input on the scan flip flops 258 and 260. Therefore, the delay through the self-timed column circuit 202 is being used to generate a pulse which clocks the flip flops 258 and 260. Concurrently, each of the other columns are running vertically as well. The signal at data-in 210 will input a signal to the B input on each of the self-timed row circuit muxes 212, 218 and 224, and similarly to the self-timed column circuit, the signals will be propagated vertically upward through the rest of the columns. The 2-input mux 218 transmits a signal from the data-out port to interconnect 236 whereupon the signal branches vertically up the column (column toggle) and transmits its data signal to the next mux 220 in the column in a serial fashion. The signal is similarly transmitted to interconnect 238 branched vertically up the column and again transmits its data signal to the B input on the next mux in the column 222. The signal is then transmitted to interconnect 240 whereupon the signal branches and transmits its data signal to the data-in port of the scan flip flop 258. Identical paths follow for each vertical column in the subarray 206.

If each interconnect module 236, 238, 240 is working properly in that particular column (similarly for each of the other columns in the subarray 206), the signal arriving at the data-in port of the scan flip flop 258 should precede the signal arriving at the clock in port of the scan flip flop 258 from the OR cell 266 by a known amount of time dependant upon the clock pulse out timing of the pulse generator 254.

The entire delay can be calculated from the timing of the data-in 210 signal passing through an inverter cell 248 and proceeding directly to the scan data port of the scan flip flop 258. Each of the column scan flip flops is triggered to be in scan mode by a scan enable toggle 250 that is received by each of the scan flip flops 258, 260, 262 and 264. As stated, if all interconnect modules in the columns are working properly, the data reaches each column flip flop 258 and 260 at the same time. At this point the flop flops receive a clock pulse signal 252 via the B input port of the OR cell 266 and the data is loaded into the flip flops 258 and 260 in a non-scan mode, thus, the scan enable signal 250 is not triggered allowing a parallel load into the flip flops 258 and 260. Once the self-timed circuit has finished, the scan enable 250 is triggered and the clock signal 252 is used to clock the scan box and scan the data out serially through the column data-out 214.

Summarizing, data is transitioned into the speed circuit with one column of the array being utilized as the self-timed circuitry. The self-timed column delay is used to parallel load the data from each column into the column shift registers by generating a clock pulse from the clock pulse generator circuit 254 which travels through the OR cell 266 which then clocks the flip flops 258 and 260 and loads all the parallel data from each column in the subarray 206. Then data is no longer transitioned in, and the scan enable signal 250 is triggered from low to high and the external clock 252, at a much lower frequency, the data is then scanned out through the column data-out 214. Since the data is loaded into the shift registers in parallel and serially scanned out, the data can be evaluated by looking at the failing test vectors. The location of the failure for a row and column correspond to that array location.

The horizontal rows work in a similar fashion. If the column select toggle 208 is set to accept A data it tests rows of interconnects horizontally in the array. The data signal at data-in 210 inputs a signal to the A input on the 2-input mux 212 in the self-timed row circuit 204, and transmit a signal from the data-out port on the mux 212. This signal is then transmitted to interconnect 230 whereupon the signal branches either vertically up the column (column toggle) or branches horizontally across the row (row toggle) and transmits its data signal to the next mux in a serial fashion. In this case the signal branches to the A input on the next mux in the row 218. The signal is similarly transmitted to interconnect 236 whereupon the signal branches horizontally across the row (row toggle) and again transmits its data signal to the A input on the next mux in the row 224. Likewise, the signal is then transmitted to interconnect 242 whereupon the signal branches and transmits its data signal to the data-in port of the pulse generator 256.

The pulse generator 256 generates a clock pulse which is transmitted through the OR cell 268 and is received by the clock input on the scan flip flops 264 and 262. Therefore, the delay through the self-timed row circuit 204 is generating a pulse that clocks the flip flops 264 and 262. Concurrently, each of the other rows in the subarray 206 are running horizontally as well. The data signal at data-in 210 will input a signal to the a input on each of the self-timed row circuit muxes 212, 214 and 216, and similarly to the self-timed row circuit, the signals are propagated horizontally across through the rest of the rows. The 2-input mux 214 transmits a signal from the data-out port on the mux 212 to interconnect 232 whereupon the signal branches horizontally across the row (row toggle) and transmits its data signal to the next mux 220 in the row in a serial fashion. The signal is similarly transmitted to interconnect 238 branched horizontally across the row and again transmits its data signal to the A input on the next mux in the row 226. The signal is then transmitted to interconnect 244 whereupon the signal branches and transmits its data signal to the data-in port of the scan flip flop 264. Identical paths follow for each horizontal row in the subarray 206.

If each interconnect module 232, 238, 244 is working properly in that particular row, (similarly for each of the other rows in the subarray 206), the signal arriving at the data-in port of the scan flip flop 264 should precede the signal arriving at the clock in port of the scan flip flop 264 from the OR cell 268 by a known amount of time dependant upon the clock pulse out timing of the pulse generator 256. The entire delay can be calculated from the timing of the data-in 210 signal passing through an inverter cell 248 and proceeding directly to the scan data port of the scan flip flop 256. Each of the row scan flip flops is triggered to be in scan mode by a scan enable toggle 250 that is received by each of the scan flip flops 258, 260, 262 and 264. As stated, if all interconnect modules in the rows in the subarray 206 are working properly, the data reaches each row flip flop 264 and 262 at the same time. At this point the flop flops receive a clock pulse signal 252 via the A input port of the OR cell 268 and the data is loaded into the flip flops 264 and 262 in a non-scan mode, thus, the scan enable signal 250 is not triggered allowing a parallel load into the flip flops 264 and 262. Once the self-timed circuit has finished, the scan enable 250 is triggered and the clock signal 252 is used to clock the scan box and scan the data out serially through the row data-out 212.

Summarizing, data is transitioned into the speed circuit with one row of the array being utilized as the self-timed circuitry. The self-timed row delay is used to parallel load the data from each row into the row shift registers by generating a clock pulse from the clock pulse generator circuit 256 that travels through the OR cell 268 which then clocks the flip flops 264 and 262 and loads all the parallel data from each row in the subarray 206. Then data is no longer transitioned in, and the scan enable signal 250 is triggered from low to high and the external clock 252, at a much lower frequency, the data is then scanned out through the row data-out 212. Since the data is loaded into the shift registers in parallel and serially scanned out, the data can be evaluated by looking at the failing test vectors. The location of the failure for a row and column correspond to that array location.

In an alternative embodiment, a delay may be added with a delay cell after the pulse generator circuit 254, 256 and the OR cell 266, 268, so that the clock pulse will arrive at a later time. This could be done if the test vehicle needs more time to allow for the columns signal to register the data. Typically, the propagation from the pulse generator circuit and the OR cell you should create sufficient delay, but if the array is very large, there is more variability and such compensation may be necessary.

Figure 3:
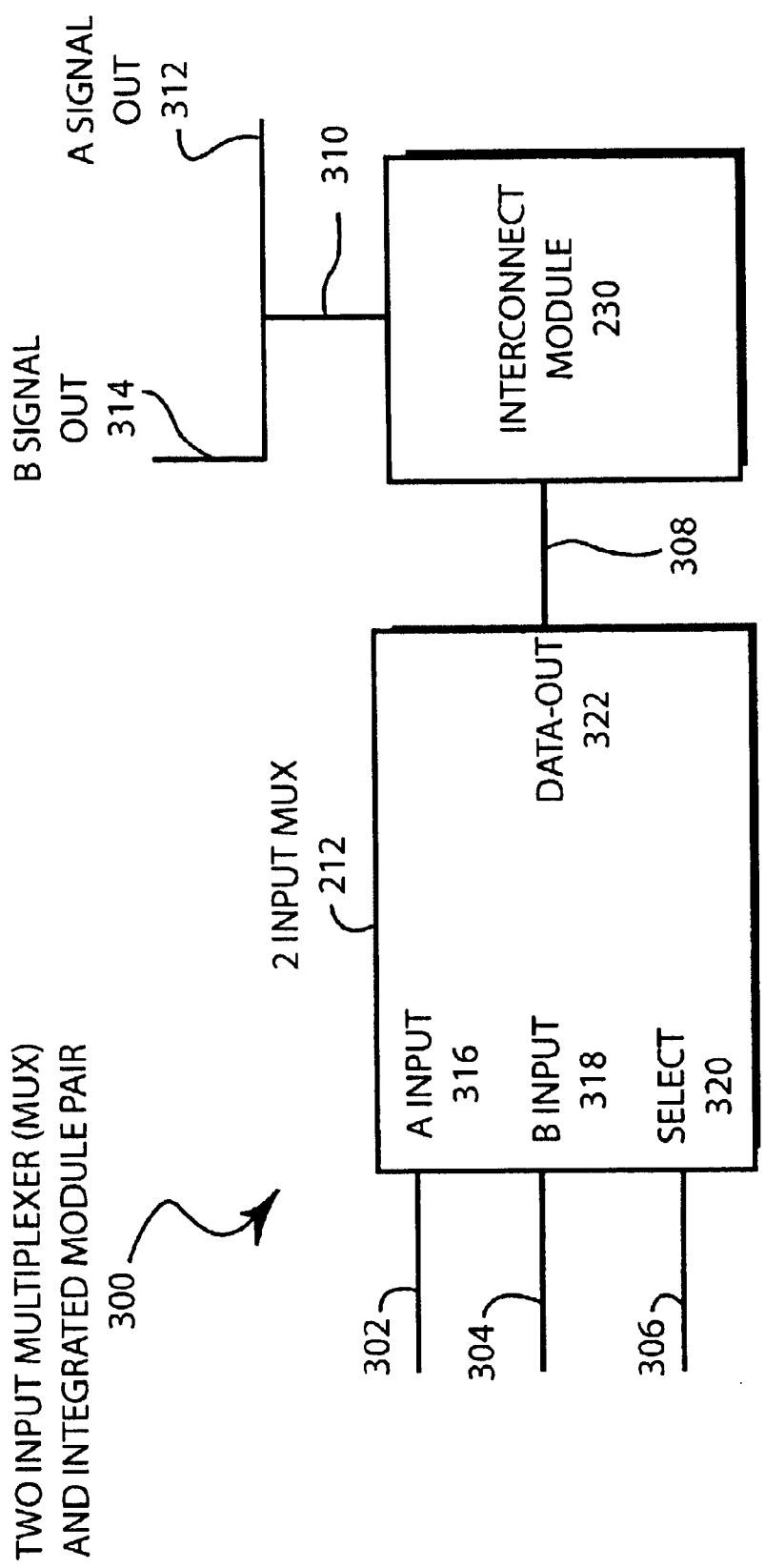
FIG. 3 is a schematic diagram of a two input multiplexer and interconnect module pair of the self-timed resistive fault test vehicle illustrated in FIGS. 2A and FIG. 2B.

FIG. 3 illustrates an embodiment of the present invention with a schematic representation of a two input multiplexer and interconnect module pair of the self-timed resistive fault test vehicle of illustrated in FIG. 2A and FIG. 2B. This detail illustrates the workings of the two input mux 212 and its interaction with the individual interconnect module 230. As a signal is input to the mux 212, a select input 306 is triggered with an external row/column select signal 208 (shown in FIG. 2) that specifies utilizing either the row A input port 316 and the respective A input signal 302, or the column B input port 318 and the respective B input signal 304. Either input signal is transmitted by the data-out port 322 of the input mux 212 to the interconnect module 230 via path 308. The interconnect module 230 receives and outputs the signal. If the row/column select signal is triggered to row A input port 316, then the output signal 310 directs the A signal out 312 and the path is directed serially along the entire row of mux and interconnect module pairs. If the row/column select signal is triggered to column B input port 318, then the output signal 310 directs the B signal out 314 and the path is directed serially along the entire column of mux and interconnect module pairs.

In a typical embodiment, the mux and interconnect module pair circuit 300 may be connected end to end many times, possibly hundreds or thousands of times in a single integrated circuit. In a typical manufacturing process, the failure rate for interconnect modules or other integrated circuit components during process development may be in the range of 1:100,000 or higher. Thus, it may be useful to have circuits with at least 100,000 or 1,000,000 interconnect modules that are easily analyzed for failures. The manufacturing process is stressed by having to manufacture a very high number of interconnect modules or other difficult-to-manufacture features.

With each clock cycle, data must simultaneously propagate through the rows or columns of mux and interconnect module pairs. If a problem exists within one of the many interconnect modules, the data will not propagate properly and will become corrupted. Such problems become more apparent when the clock speeds are high. The present embodiment, when tested at high speeds, will detect more subtle resistive changes between elements and may be a more thorough test of the manufacturing process.

In different embodiments, the string of mux and interconnect module pairs 300 may be of different lengths and the number of flip flops may also be different. For example, when many mux and interconnect module pairs are used, the propagation times will be high and thus the clock speeds will be lower. Such an example may be useful when the available test equipment may not be fast enough to test shorter strings of and interconnect modules. Other embodiments may be created by those skilled in the arts that incorporate other test circuits while maintaining within the spirit and intent of the present invention.

Figure 4:
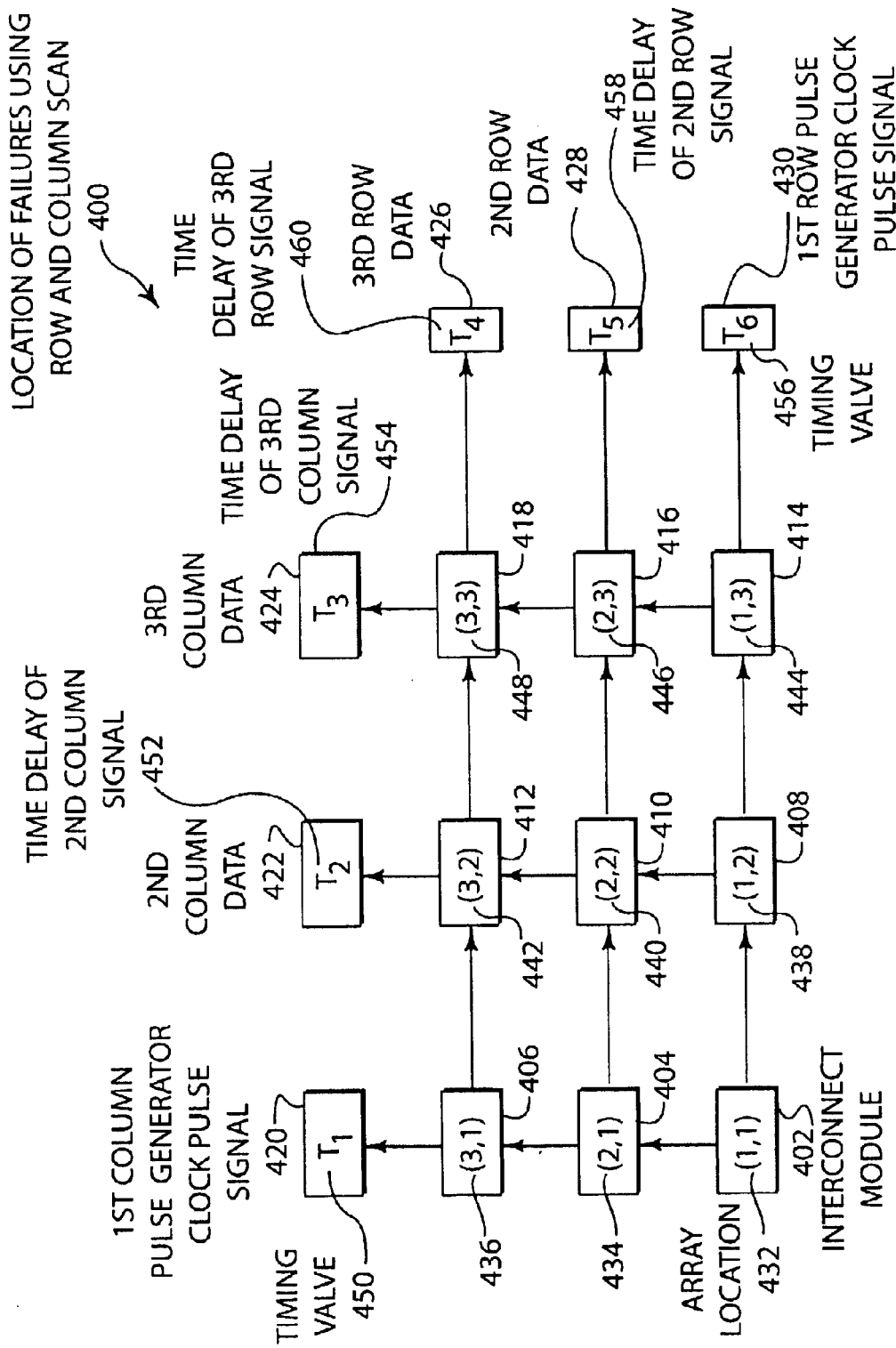
FIG. 4 is an illustration of a graphic representation of the self-timed resistive fault test vehicle described in FIG. 2A and FIG. 2B.

FIG. 4 illustrates an embodiment of the present invention with a graphic representation of the self-timed resistive fault test vehicle illustrated in FIG. 2A and FIG. 2B. This detail demonstrates the ability to locate and isolate an individual interconnect module that is not functioning properly. As shown in FIG. 4, 2-input mux and interconnect pair circuits 402–418 are laid out in linear rows and columns of a 3×3 array for testing. By assigning a 2-dimentional matrix layout to the interconnect module array, we can place an array location assignment to each component based upon its row and column position. The array location 432–448 of each of the interconnect pair circuits 402–418 is denoted as (X, Y) coordinates. The timing value 450 of the first column is indicated in the first column pulse generator clock pulse signal 420. This timing value 450 is compared to the time delay of the second column signal 452 in the second column data register 422 and to each successive column signal of each successive column data register.

Similarly, the timing value 456 of the first row is indicated in the first row pulse generator clock pulse signal 430. This timing value 456 is compared to the time delay of the second row signal 458 in the second row data register 428 and to each successive row signal of each successive row data register. Discrepancies between the timing of the column and row signal propagation times are easily read in these registers and outlying times indicate an error in that particular row or column. For example, a column scan indicating a time delay $T_2$ in the second column signal 452, that is for instance, twice that of the other columns and the anticipated time would indicate an error in one of the column 2 components or structures. A successive row scan indicating a time delay $T_5$ in the second row signal 458, that is for instance, twice that of the other rows and the anticipated time would indicate an error in one of the row 2 components or structures. This then indicates that the component delivering improper timing to the test vehicle is located at (2,2) 440 and is interconnect module 410.

Therefore one row and one column of the array are used as the self-timed circuitry. The self-timed column delay is used to parallel load the data from each column into the column shift registers. The self-timed row delay is used to parallel load the data from each row into the row shift registers. Since the data is loaded into the shift registers in parallel and serially scanned out, the data can be evaluated by looking at the failing test vectors. The location of the failure for a row and column correspond to that array location. This invention provides a wide degree of diversity because the programmable interconnect modules can be filled with a wide variety of metal combs or serpentines, via chains, library cells, active combs and serpentines etc. Since the data from all columns is parallel loaded in to shift registers, it can be serially shifted out to an external test pin. Similarly, since the data from all rows is parallel loaded in to shift registers, it too can be serially shifted out to an external test pin. The invention provides a test vehicle in which the data can flow vertically or horizontally through the array. This provides for very low test memory and vector requirements. The number of vectors needed for test is equal to two times the row height plus the column height. For example an array of muxes 50×50 would result in approximately 200 test vectors. This is the amount of vectors needed to serially scan out the data from the shift registers. In one test pass, the device would feed all 1's to the array (parallel load and serial scan out) and then all 0's to the array (parallel load and serial scan out). For this particular embodiment, only 4 input pins, 2 output pins, 1 power and 1 ground pin are needed. In an additional embodiment, the two output pins could be combined into 1 output pin by tying the two shift registers together.

The various embodiments are useful for the development and verification of integrated circuit manufacturing processes. In a typical use, one of the embodiments would be designed using target design parameters for a new manufacturing process. Such design parameters may include At-speed performance characteristics of the interconnect modules. An embodiment may be manufactured into an integrated circuit using the new manufacturing process. Any problems with the integrated circuit are quickly isolated to the exact interconnect module where the problem exists.

The problems can then be traced back to the specific process, reticule, or other manufacturing issue as necessary. When the process is able to produce one or more of the embodiments of the present invention without creating any faults, the process may be certified and mass production may begin.

The embodiments may be further useful for verifying existing manufacturing processes. For an established manufacturing process, it may be desirable to periodically produce one of the various embodiments to evaluate any problems with the manufacturing process and to verify proper operation.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of locating a fault within an array of integrated circuits comprising:
    establishing a first propagation speed for a signal passing through a first self timed circuit within said array of interconnect modules containing a first row of serially connected interconnect modules;
    establishing row propagation speeds for signals passed through a number of rows of serially connected interconnect modules of a subarray within said array of interconnect modules;
    comparing said row propagation speed to said first propagation speed to establish a row fault criteria;
    establishing a second propagation speed for a signal passing through a second self timed circuit within said array of interconnect modules containing a first column of serially connected interconnect modules;
    establishing column propagation speeds for signals passing through a plurality of columns of serially connected interconnect modules of said subarray within said array of interconnect modules;
    comparing said column propagation speed with said first propagation speed to establish a column fault criteria;
    generating a matrix of row and column fault conditions based upon said row and column fault criteria;
    locating a fault within said array of interconnect modules by utilizing said row and column fault conditions within said matrix that correspond to an array location.

2. The method of claim 1 wherein said step of establishing a first propagation speed for a signal passing through said first self timed circuit within said array of interconnect modules containing said first row of serially connected interconnect modules further comprises:
    aligning said first row of serially connected interconnect modules with a first axis.

3. The method of claim 1 wherein said step of establishing said second propagation speed for said signal passing through said second self timed circuit within said array of interconnect modules containing said first column of serially connected interconnect modules further comprises:
    aligning said first column of serially connected interconnect modules with a second axis, and aligning said second axis substantially perpendicular to said first axis.

4. The method of claim 1 wherein said step of establishing row propagation speeds for signals passed through said plurality of rows of serially connected interconnect modules of said subarray within said array of interconnect modules further comprises:
    aligning said number of rows of serially connected interconnect modules of said subarray substantially with said first axis.

5. The method of claim 1 wherein said step of establishing said column propagation speeds for signals passing through said plurality of columns of serially connected interconnect modules of said subarray within said array of interconnect modules further comprises:
    aligning said plurality of columns of serially connected interconnect modules of said subarray are substantially aligned with said second axis.

6. The method of claim 1 further comprising the step of:
    applying a row/column select signal input into said array of interconnect modules to switch a data-in signal path either through said rows or said columns of said array of interconnect modules.

7. The method of claim 1 further comprising the step of:
    registering said row propagation speeds for said rows of serially connected interconnect modules of said subarray with a row scan flop logic circuit.

8. The method of claim 7 wherein said step of registering said row propagation speeds for said rows of serially connected interconnect modules of said subarray with said plurality row scan flop logic circuit further comprises:
    driving a row clock pulse circuit with a self-timed row delay of said first self timed circuit, and generating a row clock pulse signal to load data from said row scan flop logic circuit.

9. The method of claim 8 further comprising the step of:
    delaying said row clock pulse signal with a row delay cell after said row clock pulse circuit so that said row clock pulse will arrive at a later time.

10. The method of claim 1 further comprising the step of:
    registering said column propagation speeds for said column of serially connected interconnect modules of said subarray with a column scan flop logic circuit.

11. The method of claim 10 wherein the step of registering said column propagation speeds for said columns of serially connected interconnect modules of said subarray with said column scan flop logic circuit further comprises:
    driving a column clock pulse circuit with a self-timed column delay of said second self timed circuit, and generating a column clock pulse signal to load data from said column scan flop logic circuit.

12. The method of claim 11 further comprising the step of:
    delaying said column clock pulse signal with a column delay cell after said column clock pulse circuit so that said column clock pulse will arrive at a later time.

13. A method of testing an array of interconnect modules comprising:
    providing a self timed speed fault reliability and yield test vehicle, said test vehicle comprising a first self timed circuit comprising a row of serially connected interconnect modules within said array of interconnect modules and a first output, a second self timed circuit comprising: a column of serially connected interconnect modules within said array of interconnect modules and a second output, a subarray of interconnect modules disposed between said first self timed circuit and said second self timed circuit said subarray of interconnect modules comprising rows of serially connected interconnect modules with row outputs and columns of serially connected interconnect modules with column outputs, a row scan flop logic circuit that receives said row outputs of said rows of serially connected interconnect modules of said subarray, a row clock pulse circuit with a self-timed row delay that receives said first output of said first self timed circuit and generates a clock pulse signal to load data in a parallel manner from each row into row shift registers, a column scan flop logic circuit that receives said column outputs of said columns of serially connected interconnect modules of said subarray, a column clock pulse circuit with a self-timed column delay that receives said second output of said second self timed circuit and generates a clock pulse signal to load data in a parallel manner from each column into column shift registers, a row/column select signal input into said first self timed circuit, said second self timed circuit and said subarray of interconnect modules switching the path of said data-in signal either through said rows of said array of interconnect modules or through said columns of said array of interconnect modules, a clock signal that clocks said column scan flop logic circuit to output data through a column data-out signal output when said column select signal is selected or clocks said row scan flop logic circuit to scan data out through a row data-out signal output when said row/column select signal is selected, a scan enable signal to reset said row and column scan flop logic circuits and allow input of a data-in signal, said data-in signal that is input into said array of interconnect modules, said data signal traveling through and registering propagation timing through either said rows or said columns of said array of interconnect modules, a row data-out signal output from said row shift registers when said data-in signal is transmitted through said rows of said subarray of interconnect modules, said row data-out signal containing propagation timing of each said row of said subarray of interconnect modules, a column data-out signal output from said column shift registers when said data-in signal is transmitted through said columns of said subarray of interconnect modules, said column data-out signal containing propagation timing of each said column of said subarray of interconnect modules;

applying a row select signal to the row select of said row/column select input;

applying a first scan enable signal to said scan enable input;

applying a first clock signal to said clock signal input applying a first data-in signal to said data-in input;

reading a row data signal from said row data-out output;

applying a column select signal to the column select of said row/column select input;

applying a second scan enable signal to said scan enable input;

applying a second clock signal to said clock signal input applying a second data-in signal to said data-in input;

reading a column data signal from said column data-out output;

determining if said row and column data is within specification by comparing said row and column data output to expected values; and locating a failure on said test vehicle by utilizing row and column output data that is not within said specification to form an error matrix array, wherein said error matrix array correspond to said rows and columns of said array of interconnect modules.

14. A self timed speed fault test vehicle for locating a fault within an array of interconnect modules comprising:

a first self timed circuit containing a row of serially connected interconnect modules within said array of interconnect modules that establishes a first propagation speed of a signal passing through said first self timed circuit;

a second self timed circuit containing a column of serially connected interconnect modules within said array of interconnect modules that establishes a second propagation speed of a signal passing through said second self timed circuit;

a subarray of interconnect modules disposed within said array of interconnect modules comprising rows and columns of serially connected interconnect modules;

a first comparator that compares the row propagation speed of signals passed through each row of serially connected interconnect modules within said subarray to said first propagation speed, said comparison establishing a row fault criteria;

a second comparator that compares the column propagation speed of signals passed through each column of serially connected interconnect modules within said subarray to said second propagation speed, said comparison establishing a column fault criteria;

a matrix of row and column fault conditions that is generated based upon said row and column fault criteria;

a fault location map generated by utilizing said row and column fault conditions within said matrix that correspond to array locations.

15. The device of claim 14 wherein said first row of serially connected interconnect modules has a first axis and said first column of serially connected interconnect modules has a second axis that is substantially perpendicular to said first axis.

16. The device of claim 14 wherein said number of rows of serially connected interconnect modules of said subarray are substantially aligned with said first axis and, and said number of columns of serially connected interconnect modules of said subarray are substantially aligned with said second axis.

17. The device of claim 14 wherein a row/column select signal input into said array of interconnect modules is used to switch a data-in signal path either through said rows or said columns of said array of interconnect modules.

18. The device of claim 14 wherein said rows of serially connected interconnect modules of said subarray are registered with a row scan flop logic circuit.

19. The device of claim 18 wherein said first self timed circuit drives a row clock pulse circuit with a self-timed row delay and generates a clock pulse signal to load data from said row scan flop logic circuit.

20. The device of claim 19 wherein a delay is added with a row delay cell after said row clock pulse circuit so that the row clock pulse will arrive at a later time.

21. The device of claim 14 wherein said columns of serially connected interconnect modules of said subarray are registered with a column scan flop logic circuit.

22. The device of claim 21 wherein said second self timed circuit drives a column clock pulse circuit with a self-timed column delay and generates a clock pulse signal to load data from said column scan flop logic circuit.

23. The device of claim 22 wherein a delay is added with a column delay cell after said column clock pulse circuit so that the column clock pulse will arrive at a later time.

24. A self timed speed fault reliability and yield test vehicle for testing an array of integrated circuits comprising:

a first self timed circuit comprising a row of serially connected interconnect modules within said array of interconnect modules having a first axis and a first output;

a second self timed circuit comprising a column of serially connected interconnect modules within said array of interconnect modules having a second axis and a second output;

a subarray of interconnect modules disposed between said first self timed circuit and said second self timed circuit, said subarray of interconnect modules comprising rows of serially connected interconnect modules with row outputs and substantially aligned with said first axis and, and columns of serially connected interconnect modules with column outputs and substantially aligned with said second axis;

a row scan flop logic circuit that receives said row outputs of said rows of serially connected interconnect modules of said subarray;

a row clock pulse circuit with a self-timed row delay that receives said first output of said first self timed circuit and generates a clock pulse signal to load data in a parallel manner from each row into row shift registers;

a column scan flop logic circuit that receives said column outputs of said columns of serially connected interconnect modules of said subarray;

a column clock pulse circuit with a self-timed column delay that receives said second output of said second self timed circuit and generates a clock pulse signal to load data in a parallel manner from each column into column shift registers;

a row/column select signal that is applied to said first self timed circuit, said second self timed circuit and said subarray of interconnect modules switching the path of said data-in signal either through said rows of said array of interconnect modules or through said columns of said array of interconnect modules;

a clock signal that clocks said column scan flop logic circuit to transmit data through a column data-out signal output when said column select signal is selected and clocks said row scan flop logic circuit to scan data out through a row data-out signal output when said row/column select signal is selected;

a scan enable signal that resets said row and column scan flop logic circuits and allows application of a data-in signal, said data-in signal that is applied to said array of interconnect modules, said data signal traveling through and registering propagation timing through either said rows or said columns of said array of interconnect modules;

a row data-out signal that transmits data from said row shift registers when said data-in signal is transmitted through said rows of said subarray of interconnect modules to read propagation timing through said rows of said subarray of interconnect modules;

a column data-out signal that transmits data from said column shift registers when said data-in signal is transmitted through said columns of said subarray of interconnect modules to read propagation timing through said columns of said subarray of interconnect modules.

* * * * *